(12) United States Patent
Takeuchi et al.

(10) Patent No.: US 8,785,839 B2
(45) Date of Patent: Jul. 22, 2014

(54) OPTICAL SENSOR AND METHOD OF MANUFACTURING THE OPTICAL SENSOR

(75) Inventors: Hitoshi Takeuchi, Chiba (JP); Noriyuki Kimura, Chiba (JP); Koji Noguchi, Chiba (JP)

(73) Assignee: Seiko Instruments Inc. (JP)

( * ) Notice: Subject to any disclaimer, the term of this patent is extended or adjusted under 35 U.S.C. 154(b) by 131 days.

(21) Appl. No.: 13/433,418

(22) Filed: Mar. 29, 2012

(65) Prior Publication Data

US 2012/0248298 A1   Oct. 4, 2012

(30) Foreign Application Priority Data

Mar. 31, 2011   (JP) .................................. 2011-080318

(51) Int. Cl.
*H01J 5/02*   (2006.01)
*H01L 31/0203*   (2014.01)
*H01L 23/12*   (2006.01)

(52) U.S. Cl.
USPC ........................... 250/239; 257/433; 257/700

(58) Field of Classification Search
USPC ............... 250/239, 226, 214.1; 257/294, 433, 257/434, 435, 700–713, 777, 778, 784
See application file for complete search history.

(56) References Cited

U.S. PATENT DOCUMENTS 5,543,612 A * 8/1996 Kanaya et al. ............. 250/208.1
7,679,090 B2 * 3/2010 Huang et al. .................... 257/81

* cited by examiner

*Primary Examiner* — Georgia Y Epps
*Assistant Examiner* — Don Williams
(74) *Attorney, Agent, or Firm* — Adams & Wilks

(57) ABSTRACT

An optical sensor has a glass base having a concave portion, and a glass lid is bonded to the base and overlies the concave portion to form a cavity portion. A photoelectric conversion element id accommodated in the cavity portion. Internal wirings are each connected at one end to the photoelectric conversion element and extend through notches each formed at a corner of a peripheral edge along an outside surface of the base. The other ends of the internal wirings are connected inside the notches to external wirings that extend along an outside surface of the base and terminate in external terminals.

15 Claims, 11 Drawing Sheets

OPTICAL SENSOR AND METHOD OF MANUFACTURING THE OPTICAL SENSOR

BACKGROUND OF THE INVENTION

1. Field of the Invention

The present invention relates to an optical sensor and a method of manufacturing the same.

2. Description of the Related Art

Conventionally, there has been known an optical sensor including an optical element for detecting ambient brightness, which is used for dimming control in a television set or a mobile device monitor or for other purposes (see, for example, Japanese Patent Application Laid-open Nos. 2006-284474 and 2005-252041). In a photosensor (optical sensor) described in Japanese Patent Application Laid-open No. 2006-284474, a semiconductor chip (optical element) is accommodated in a package or is fixed onto a mounting board and covered by a transparent resin, and the semiconductor chip is connected to leads provided on the mounting board by bonding wires.

In a photoelectric conversion device described in Japanese Patent Application Laid-open No. 2005-252041, using flip-chip bonding (FCB), a light transmissive interposer on which a photoelectric conversion element is mounted and a mounting board are disposed to be opposed to each other at a predetermined gap, and the interposer and the mounting board are supported by solder bumps. Then, external terminals of the interposer connected to electrodes of the photoelectric conversion element are electrically connected to electrodes of the mounting board by the solder bumps. In this manner, the photoelectric conversion element is mounted on the mounting board via the interposer.

However, in the photosensor described in Japanese Patent Application Laid-open No. 2006-284474, the bonding wires extend around the semiconductor chip, and hence it is necessary to increase the size of the external shape of the package or the transparent resin in accordance with the size of the bonding wires. Thus, there is a problem that it is difficult to achieve downsizing and thinning.

On the other hand, as exemplified in the photoelectric conversion device described in Japanese Patent Application Laid-open No. 2005-252041, if the interposer and the mounting substrate are supported by the solder bumps, the postures of the interposer and the mounting board become unstable depending on the shape of the solidified solder bumps. If the interposer is tilted, the optical characteristics may be deteriorated. Depending on the amount of the solder bump, the photoelectric conversion element may contact with the mounting board, and there is another problem that the reliability is lowered. In addition, the photoelectric conversion element is not protected by a package or a resin, and hence the reliability may be deteriorated. In this case, it is conceivable to seal a resin between the interposer and the mounting board, but the sealed resin lowers the light transmission characteristics, and further it is very difficult to seal a resin so as to avoid a photoelectric conversion portion of the photoelectric conversion element. Besides, the resin may be colored with time to change the optical characteristics or moisture may permeate the resin to cause corrosion. Thus, there is a problem that the reliability is insufficient.

SUMMARY OF THE INVENTION

The present invention has been made in view of the above-mentioned circumstances, and has an object to provide a downsized and thinner optical sensor having excellent optical characteristics and improved reliability, and to also provide a method of manufacturing the optical sensor with ease.

In order to achieve the above-mentioned object, the present invention provides the following techniques.

The present invention provides an optical sensor, including: a base having a substantially plate shape and made of a glass material, the base including a concave portion in a surface thereof and a plurality of notches formed at a peripheral edge along a thickness direction; a lid portion having a flat plate shape and made of a glass material, the lid portion being bonded onto the surface of the base in a stacked state and hermetically closing the concave portion to form a cavity portion; an optical element including a light receiving portion for receiving light, the optical element being accommodated in the cavity portion so that the light receiving portion faces a surface of the lid portion opposed to the base and photoelectrically converting light that has transmitted through the lid portion and been received by the light receiving portion; a plurality of internal wirings formed on the surface of the lid portion opposed to the base, the plurality of internal wirings each including an element connection portion connected to the optical element and a wiring connection portion disposed at a position opposed to a corresponding one of the plurality of notches of the base; and a plurality of external wirings, which are each disposed along a surface of the corresponding one of the plurality of notches so that one end is connected to the wiring connection portion of a corresponding one of the plurality of internal wirings, which is disposed at the position opposed to the corresponding one of the plurality of notches of the base, and another end is exposed on a surface of the base on an opposite side of the lid portion.

According to the present invention, when the light that has transmitted through the lid portion and been received by the light receiving portion of the optical element is photoelectrically-converted into an electrical signal, the electrical signal is sent to the external wiring from the element connection portion of the internal wiring via the wiring connection portion. Another end of the external wiring is exposed on the outside surface of the base, and hence, when the optical sensor is surface-mounted onto a mounting board or the like, the another end of the external wiring functions as an external terminal to be connected to an external electrode. Thus, the electrical signal from the optical element can be output to the outside.

In this case, the optical element is accommodated in the cavity portion formed by the concave portion of the base between the base and the lid portion, and the external wiring is disposed along the surface of the notch. Therefore, downsizing and thinning are achieved. Further, the optical element is covered by the base and the lid portion, and hence the optical element can be protected to improve the reliability. Besides, the base having a substantially plate shape can be directly mounted on the mounting board or the like, and hence the posture can be stabilized to improve the optical characteristics.

In the present invention, the base may be made of a light-blocking glass material, and the lid portion may include, at least on the surface opposed to the base, an optical filter for limiting a wavelength of light to be transmitted.

This configuration prevents external light from transmitting through the base to be received by the light receiving portion. In general, the photoelectric conversion rate of an optical element fluctuates depending on the wavelength of received light. With the optical filter provided for limiting the wavelength of light to be transmitted through the lid portion, the influence of the fluctuations in photoelectric conversion rate caused by the wavelength dependency of the optical element can be reduced, and the intensity of light can be detected with high accuracy.

Further, in the above-mentioned invention, the base may be made of a light-blocking glass material, and the lid portion may be made of a light-blocking glass material having a transmission region through which light transmits, the transmission region being provided in a range in which the light receiving portion of the optical element faces the lid portion.

This configuration limits an incident direction of light to be received by the light receiving portion of the optical element in the transmission region of the lid portion, thereby preventing external light from transmitting through the entire base or a region outside the range in which the light receiving portion of the optical element faces the lid portion and being received by the receiving portion. Thus, the intensity of desired light can be detected with high accuracy.

The present invention provides a method of manufacturing an optical sensor, including: an internal wiring forming step of forming an internal wiring on a surface of a lid member having a flat plate shape and made of a glass material; an element mounting step of connecting a photoelectric conversion element to the internal wiring, which is formed on the surface of the lid member in the internal wiring forming step, and mounting the photoelectric conversion element so that a light receiving portion of the photoelectric conversion element faces the surface of the lid member; a bonding step of disposing, in a stacked state, the lid member onto which the photoelectric conversion element is mounted in the element mounting step and a base member having a substantially plate shape and made of a glass material, the base member including a concave portion in a surface thereof and a plurality of notches formed at a peripheral edge along a thickness direction, and accommodating the photoelectric conversion element in the concave portion of the base member, followed by bonding the lid member and the base member to each other so that the lid member hermetically closes the concave portion; and an external wiring forming step of forming an external wiring along a surface of each of the plurality of notches of the base member onto which the lid member is bonded in the bonding step so that one end of the external wiring is connected to the internal wiring and another end of the external wiring is exposed on a surface of the base member on an opposite side of the lid member.

According to the present invention, an optical sensor is manufactured, in which: a cavity portion is formed by the concave portion at a bonding surface between the lid member and the base member; the photoelectric conversion element is accommodated in the cavity portion, which is mounted so that the light receiving portion faces the surface of the lid member; and the another end of the external wiring connected to the photoelectric conversion element via the internal wiring is exposed on the outside surface of the base member. When the optical sensor is surface-mounted onto a mounting board or the like, the another end of the external wiring exposed on the outside surface of the base member functions as an external terminal to be connected to an external electrode. Then, the light that has transmitted through the lid member is received by the light receiving portion of the photoelectric conversion element and subjected to photoelectric conversion. In this manner, the obtained electrical signal can be output to the outside via the internal wiring and the external wiring.

In this case, the photoelectric conversion element is accommodated in the cavity portion between the base member and the lid member in the element mounting step, and the external wiring is disposed along the surface of the notch of the base in the external wiring forming step. Therefore, an optical sensor having high reliability can be manufactured while achieving downsizing and thinning. Further, the use of the base having a substantially plate shape enables mounting on a mounting board or the like with a stable posture, and hence an optical sensor having improved optical characteristics can be manufactured.

In the above-mentioned invention, the plurality of notches may be formed at corner portions of the base member, respectively, and another end of the internal wiring may be disposed at each corner portion of the lid member.

In this configuration, with the use of a large-sized glass member in which a plurality of the base members are formed and a large-sized glass member in which a plurality of the lid members are formed, the internal wirings can be formed collectively at the corner portions of adjacent lid members in the internal wiring forming step, and the external wirings can be formed collectively at the corner portions of adjacent base members in the external wiring forming step. Thus, simply by cutting the large-sized glass members on which a plurality of optical sensors are formed into individual pieces, the plurality of optical sensors can be manufactured collectively with ease.

The optical sensor according to the present invention provides the effects that the optical sensor is downsized and thinned while having improved reliability and excellent optical characteristics. The method of manufacturing an optical sensor according to the present invention provides the effect that the optical sensor described above can be manufactured with ease.

DETAILED DESCRIPTION OF THE PREFERRED EMBODIMENT

Hereinafter, an optical sensor and a method of manufacturing an optical sensor according to an embodiment of the present invention are described with reference to the accompanying drawings.

Figure 1:
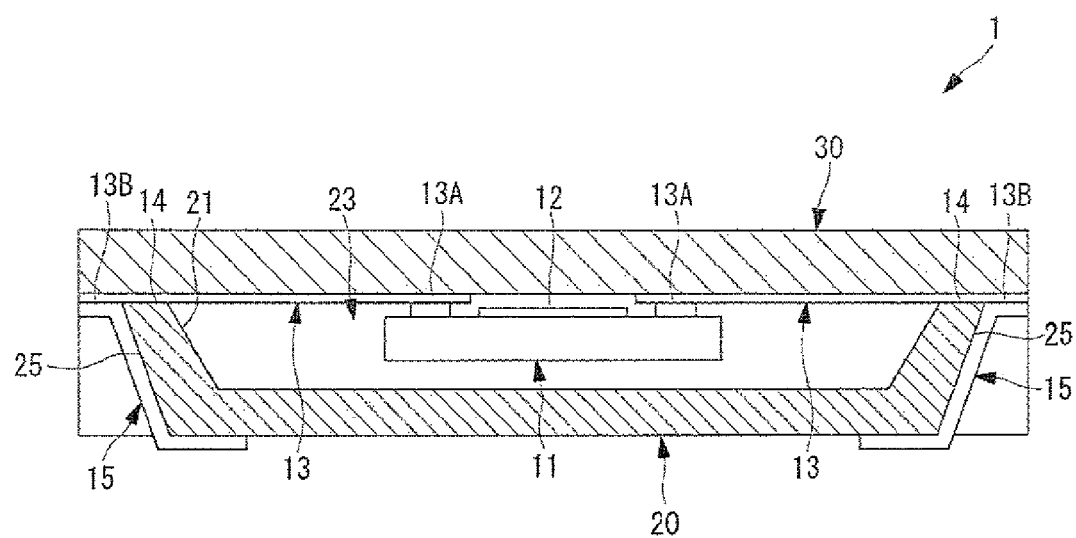
FIG. 1 is a schematic view of an optical sensor according to an embodiment of the present invention.

As illustrated in FIG. 1, an optical sensor 1 according to this embodiment includes a photoelectric conversion element (optical element) 11 for receiving light and detecting the intensity thereof, and the optical sensor 1 is thus capable of detecting ambient brightness. The optical sensor 1 is formed into, for example, a square with each side of 0.5 to 10 mm, and has a thickness of 0.2 to 1.5 mm. The optical sensor 1 has a structure in which a base 20 having a substantially plate shape and made of a glass material and a lid portion 30 having a flat plate shape and made of a transparent glass material on which the photoelectric conversion element 11 is mounted are bonded in a stacked state.

Figure 2A:
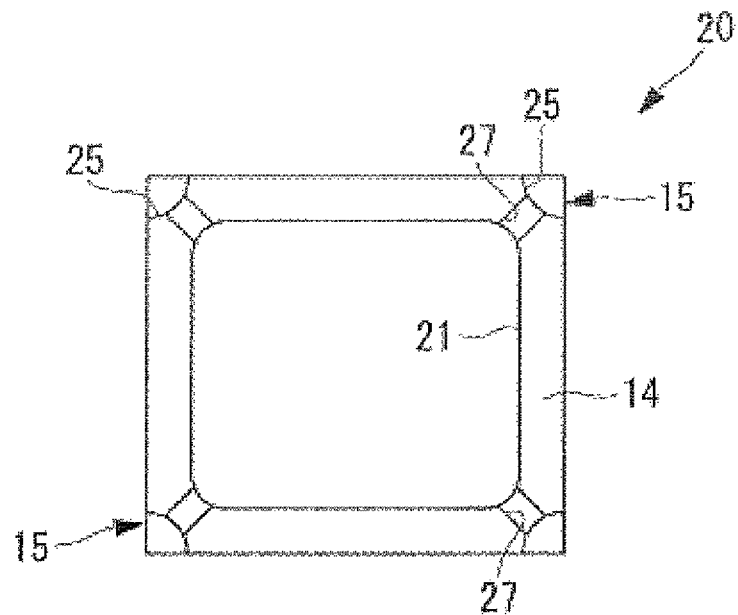
FIG. 2A is a plan view of an inside surface of a base of FIG. 1 as viewed in a thickness direction.
Figure 2B:
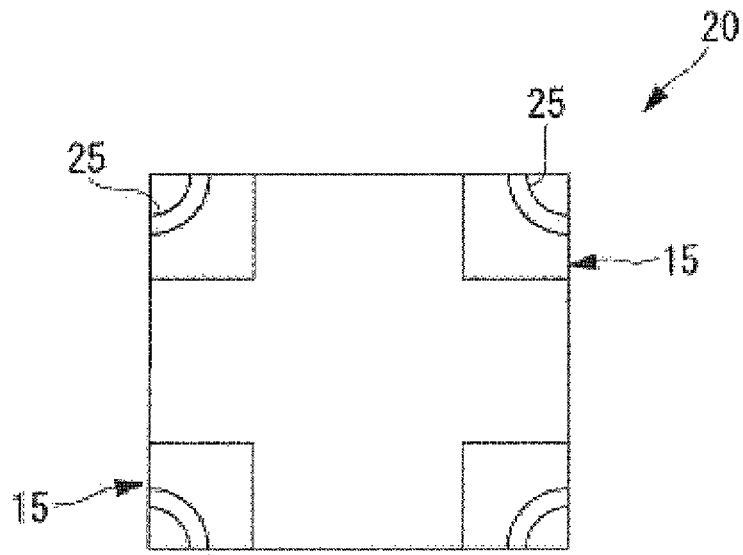
FIG. 2B is a plan view of an outside surface of the base of FIG. 1 as viewed in the thickness direction.

As illustrated in FIGS. 2A and 2B, the base 20 is formed into a square and has a thickness of, for example, 0.15 to 1.0 mm. The base 20 includes a concave portion 21 at the center of the surface (inside surface), which is recessed in a thickness direction. The size of the concave portion 21 covers a wide range of the surface (inside surface) of the base 20, and the concave portion 21 is formed into a substantially square. The concave portion 21 has an inner wall surface slightly inclined inward from an opening portion toward the bottom surface, for example, at an angle of about 45°.

The opening of the concave portion 21 is covered by the lid portion 30 so that a cavity portion 23 is formed between the base 20 and the lid portion 30. The inside of the cavity portion 23 does not always need to be in vacuum or may be in vacuum as necessary. For example, in order to prevent expansion of gas inside the cavity portion 23 during heating, the opening of the concave portion 21 may be sealed so as to reduce the pressure. It is desired that the cavity portion 23 be completely closed hermetically, but penetration of gas or liquid is allowed as long as the reliability of the optical sensor 1 is not impaired.

Figure 12A:
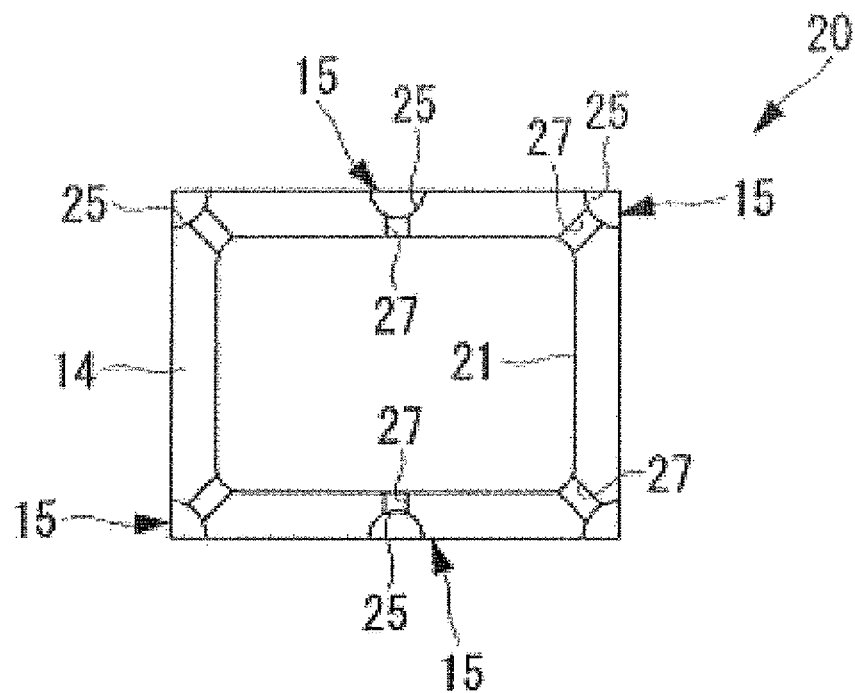
FIG. 12A is a plan view of an inside surface of a base according to the another modified example of the embodiment of the present invention as viewed in the thickness direction.
Figure 12B:
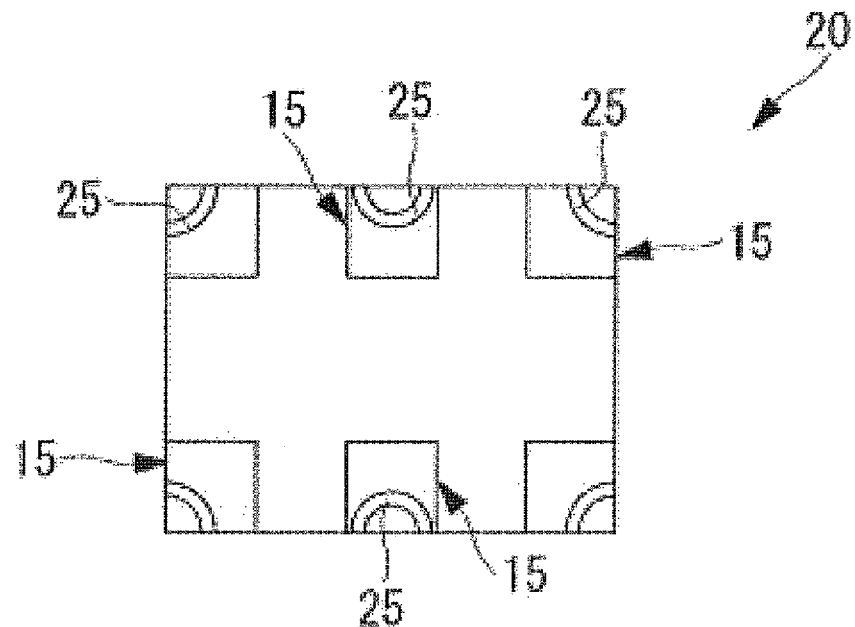
FIG. 12B is a plan view of an outside surface of the base of FIG. 12A as viewed in the thickness direction.

The base 20 includes, at the four corners of the peripheral edge, notches 25 whose corner portions are cut out. The notch 25 has a surface shape which is recessed inward into a quarter circular arc. The notch 25 is formed so as to be slightly inclined inward from a bonding surface 14 between the base 20 and the lid portion 30 toward an opposite surface (outside surface) of the base 20. For example, the notch 25 has an inclination of about 5 to 25°, preferably 10 to 15°, with respect to the thickness direction. Therefore, the thickness between the notch 25 and the concave portion 21 changes to be gradually larger from the opening of the concave portion 21 toward the bottom surface thereof. FIG. 2A illustrates the state in which an external wiring 15 to be described later is formed on the surface of the notch 25 of the base 20. FIG. 2B illustrates the state in which the external wirings 15 are formed on the outside surface of the base 20 and the surface of the notch 25. The base 20 itself has no corner portions at the four corners because of the notches 25. FIGS. 12A and 12B illustrate the same states.

In the surface of the base 20 on the concave portion 21 side (bonding surface 14), four groove portions 27 which are slightly recessed in the thickness direction are formed between the four corners of the concave portion 21 and their adjacent notches 25, respectively. Examples of the material of the base 20 include soda glass, borosilicate glass, crystallized glass, and alkali-free glass.

Figure 3A:
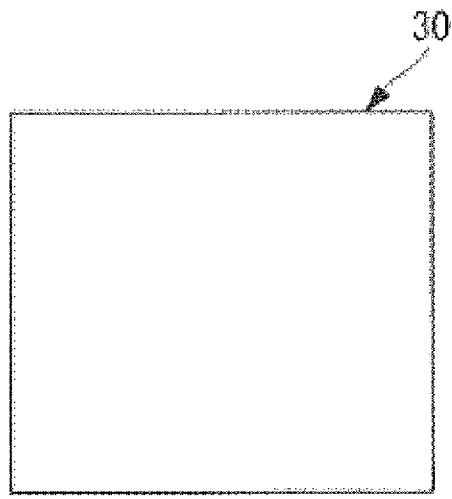
FIG. 3A is a plan view of an outside surface of a lid portion of FIG. 1 as viewed in the thickness direction.
Figure 3B:
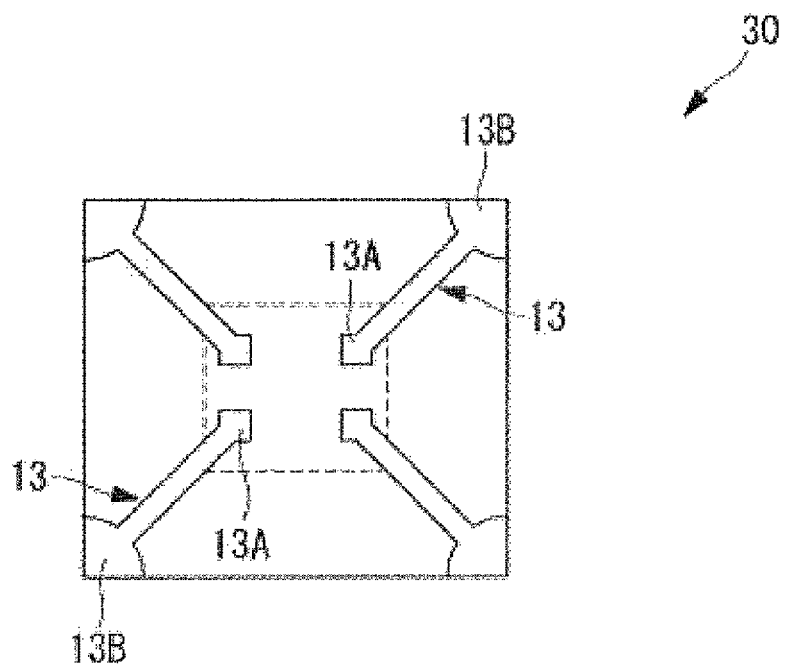
FIG. 3B is a plan view of an inside surface of the lid portion of FIG. 1 as viewed in the thickness direction.

As illustrated in FIGS. 3A and 3B, the lid portion 30 is formed into a square having the same size of the base 20, and has a thickness of, for example, 0.05 to 1.0 mm. The lid portion 30 is disposed on the surface of the base 20 (bonding surface 14) so as to hermetically close the concave portion 21. Examples of the material of the lid portion 30 include, similarly to the base 20, soda glass, borosilicate glass, crystallized glass, and alkali-free glass. In the surface (inside surface) of the lid portion 30 on the base 20 side, internal wirings 13 are formed from the four corners toward the center of the lid portion 30.

One end of each of the internal wirings 13 extends to the vicinity of the center of the surface (inside surface) of the lid portion 30 and is disposed at an interval so as not to contact with one end of the other internal wirings 13. The other end of each of the internal wirings 13 is disposed at each corner portion of the lid portion 30 and is formed into a fan shape. Each of the internal wirings 13 is accommodated in the groove portion 27 of the base 20 at the bonding surface 14 between the lid portion 30 and the base 20. Hereinafter, the one end of the internal wiring 13 is referred to as element connection portion 13A and the other end thereof is referred to as wiring connection portion 13B. As the internal wiring 13, for example, a metal such as Au, Ag, Cu, Ni, Cr, Ti, Pt, Al, or Sn may be used alone or an alloy thereof may be used, or alternatively, a laminate of those may be used.

The photoelectric conversion element 11 includes a light receiving portion 12 for receiving light, and is capable of outputting an electrical signal by photoelectrically-converting the light received by the light receiving portion 12. The photoelectric conversion element 11 is formed into a smaller square than the concave portion 21 of the base 20, and has each side of 0.3 to 7 mm and a thickness of 0.05 to 1.0 mm, for example.

The photoelectric conversion element 11 is mounted so that the light receiving portion 12 faces the surface (inside surface) of the lid portion 30 opposed to the base 20, and is accommodated in the cavity portion 23 formed by the concave portion 21. A predetermined gap is formed between the surface of the photoelectric conversion element 11 on the base 20 side and the bottom surface of the concave portion 21, thereby preventing contact therebetween. The photoelectric conversion element 11 is connected to the wiring connection portions 13A of four internal wirings 13.

In the optical sensor 1, four external wirings 15 are formed along the surfaces of the respective notches 25 of the base 20. One end of the external wiring 15 is connected to the wiring connection portion 13B of the internal wiring 13, and the other end thereof is exposed on the surface (outside surface) of the base 20 on the opposite side of the lid portion 30. As the external wiring 15, for example, similarly to the internal wiring 13, a metal such as Au, Ag, Cu, Ni, Cr, Ti, Pt, Al, or Sn may be used alone or an alloy thereof may be used, or alternatively, a laminate of those may be used.

Figure 4:
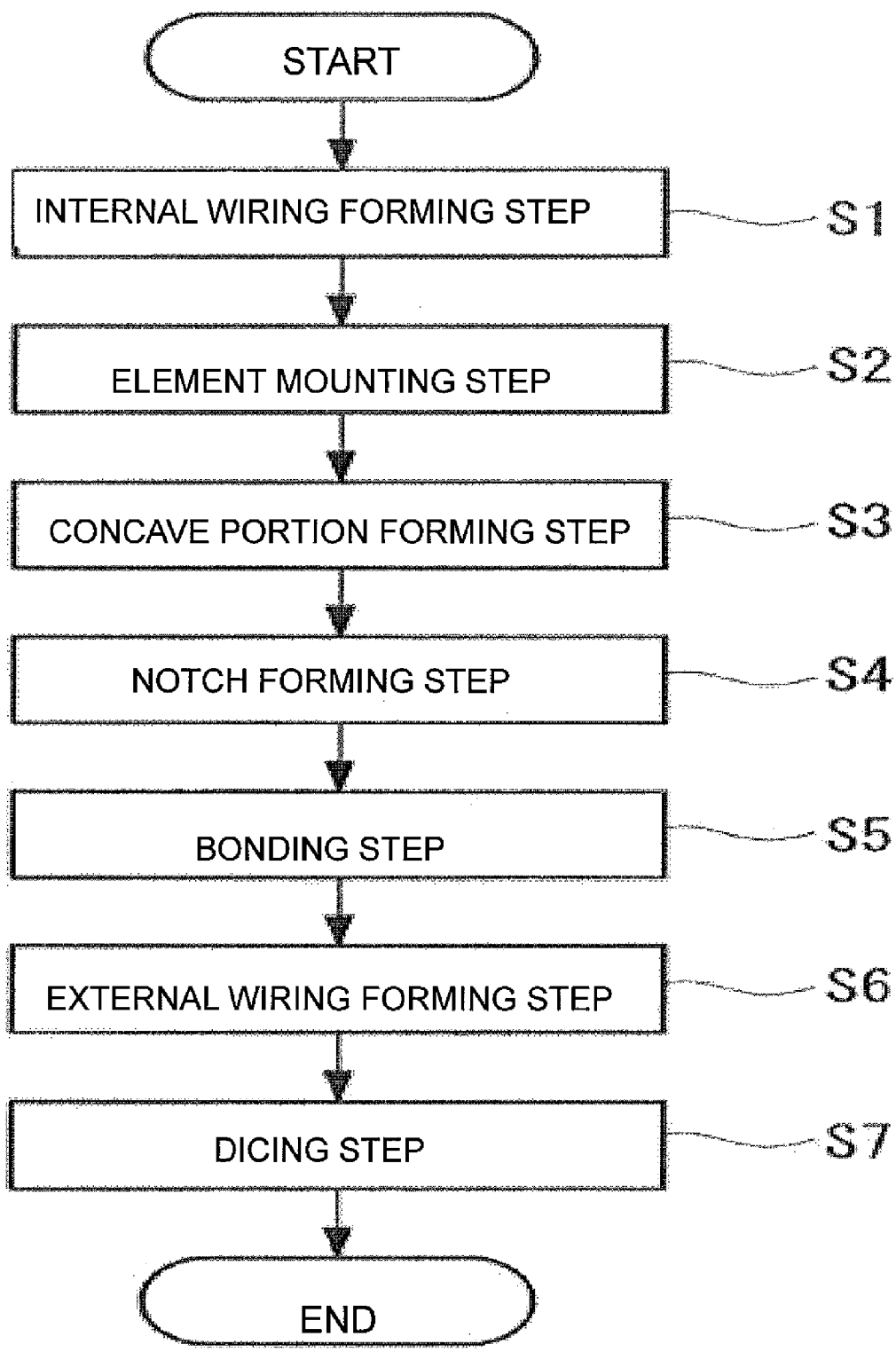
FIG. 4 is a flowchart illustrating a method of manufacturing an optical sensor according to the embodiment of the present invention.

Next, the method of manufacturing the optical sensor 1 according to this embodiment is described with reference to a flowchart of FIG. 4.

In this embodiment, for example, a large-sized lid member (not shown) made of a glass material and having a predetermined thickness in which a plurality of the lid portions 30 are formed and a large-sized base member (not shown) made of a glass material and having a predetermined thickness in which a plurality of the bases 20 are formed are used.

The method of manufacturing the optical sensor 1 according to this embodiment includes an internal wiring forming step S1 of forming the internal wirings 13 on the surface of the lid member, an element mounting step S2 of mounting the photoelectric conversion element 11 on the surface of the lid member on which the internal wirings 13 are formed in the internal wiring forming step S1, a concave portion forming step S3 of forming the concave portion 21 in the surface of the base member, a notch forming step S4 of forming the notches 25 in the surface of the base member, a bonding step S5 of bonding the lid member on which the photoelectric conversion element 11 is mounted in the element mounting step S2 and the base member having the concave portion 21 and the notches 25 to each other in a stacked state, an external wiring forming step S6 of forming the external wiring 15 along the surface of each notch 25 of the base member onto which the lid member is bonded in the bonding step S5, and a dicing step S7 of cutting the lid member and the base member on which the external wirings 15 are formed in the external wiring forming step S6 into individual optical sensors 1.

In the internal wiring forming step S1, the internal wirings 13 are formed collectively for each region of a plurality of adjacent lid portions 30 of the lid member. Specifically, the internal wirings 13 are disposed on the surface of the lid member in the diagonal direction so as to connect the vicinities of substantially the centers of regions of two adjacent lid portions 30, and the internal wirings 13 are formed at an interval so that one end of the internal wiring 13 does not contact with one end of another internal wiring 13. The internal wiring 13 can be formed by, for example, sputtering, vapor deposition, printing, or plating alone or in combination.

In the element mounting step S2, for each region of the lid portions 30 on the surface of the lid member, the photoelectric conversion element 11 is connected to each of the element connection portions 13A of four internal wirings 13 formed in the vicinity of the center of the lid portion 30, and the photoelectric conversion element 11 is mounted so that the light receiving portion 12 faces the surface of the lid member (flip-chip bonding (FOB) mounting). For example, the photoelectric conversion element 11 and the internal wirings 13 are electrically and mechanically bonded to each other in a manner that a protruding electrode (such as Au, Ag, or solder) is provided to an electrode portion (not shown) of the photoelectric conversion element 11 or the wiring connection portion 13A of the internal wiring 13 on the lid member, and ultrasonic wave, load, heat, or the like is applied to the protruding electrode.

In the concave portion forming step S3, for each region of the individual bases 20 of the base member, the concave portion 21 is formed. The concave portion 21 can be formed by, for example, subjecting the base member to hot pressing, sandblasting, or acid etching.

In the notch forming step S4, for each region of a plurality of adjacent bases 20 of the base member, the notches 25 are collectively formed. Specifically, a tapered through hole (notch 25) is formed along the thickness direction at the center of the region of four bases 20 in total on the surface of the base member, two of which are adjacent vertically and the other two are adjacent horizontally.

The notch 25 can be formed by, for example, subjecting the base member to hot pressing, sandblasting, or acid etching, similarly to the concave portion 21.

The order of the concave portion forming step S3 and the notch forming step S4 may be arbitrary, and the concave portion forming step S3 and the notch forming step S4 may be performed at the same time. In the concave portion forming step S3 or the notch forming step S4, the groove portions 27 are formed in the surface of the base member for each region of the bases 20.

In the bonding step S5, the base member and the lid member are disposed in a stacked state in the thickness direction, and the photoelectric conversion element 11 mounted onto the lid member is accommodated in the concave portion 21 of the base member, followed by bonding the lid member and the base to each other. In this case, the internal wiring 13 are accommodated in the groove portion 27 of the base 20, and the concave portion 21 is hermetically closed by the lid member. Examples of the bonding method include anodic bonding, bonding using an adhesive, direct bonding, Au—Sn bonding, Au—Au bonding, and bonding using solder.

In the external wiring forming step S6, the external wiring 15 is formed along the surface of the through hole (notch 25) formed in the base member so that one end of the external wiring 15 is connected to the wiring connection portion 13B of the internal wiring 13 formed on the lid member and the other end thereof is exposed on the surface of the base member on the opposite side of the lid member. The external wiring 15 can be formed by, for example, sputtering, vapor deposition, printing, or plating alone or in combination, similarly to the internal wiring 13.

In the dicing step S7, the base member and the lid member, which are bonded in the stacked state, are cut into individual bases 20 and lid portions 30. This way, the wiring connection portion 13B of the internal wiring 13 of the lid member and the notch 25 of the base member are divided into four or two, respectively, thereby manufacturing a plurality of optical sensors 1 each including four internal wirings 13 and four external wirings 15, in which the photoelectric conversion element 11 is accommodated in the cavity portion 23 between the base 20 and the lid portion 30.

Next, the action of the optical sensor 1 and the manufacturing method therefor configured as described above according to this embodiment is described.

According to the optical sensor 1 of this embodiment, external light that has transmitted through the lid portion 30 and entered the optical sensor 1 is received by the light receiving portion of the photoelectric conversion element 11 and photoelectrically-converted into an electrical signal. The electrical signal is then sent to the external wiring 15 from the element connection portion 13A of the internal wiring 13 via the wiring connection portion 13B.

Figure 5:
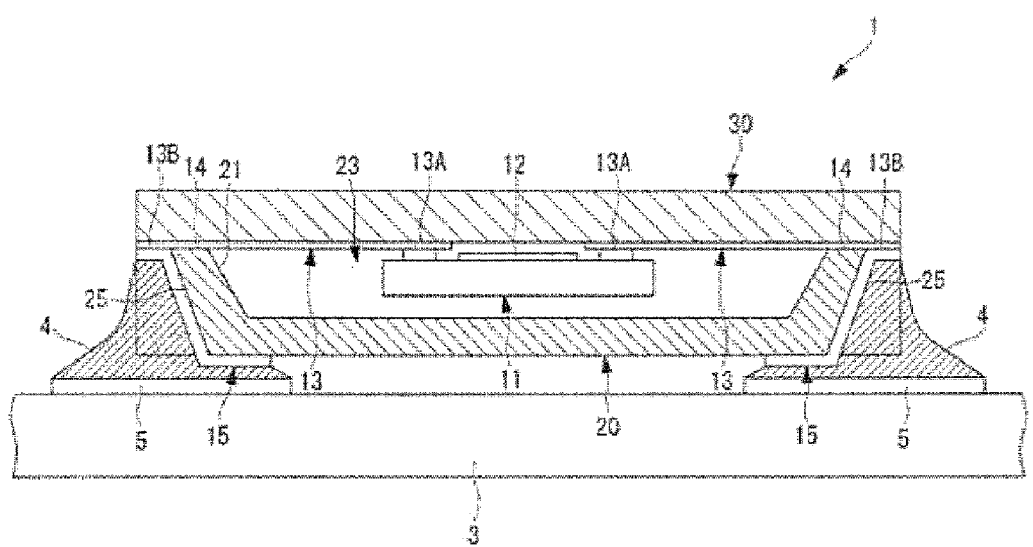
FIG. 5 is a schematic view illustrating a state in which the optical sensor of FIG. 1 is mounted onto a circuit board.

The other end of the external wiring 15 is exposed on the outside surface of the base 20, and hence, as illustrated in FIG. 5, when the optical sensor 1 is surface-mounted onto a circuit board (mounting board) 3 via solder 4, the other end of the external wiring 15 can function as an external terminal to be connected to aboard electrode (external electrode) 5. Thus, the electrical signal from the photoelectric conversion element 11 can be output to the outside via the board electrode 5. In this way, an electronic device is obtained, which is capable of adjusting backlight brightness of a liquid crystal screen based on sensing information (electrical signal) acquired from the photoelectric conversion element 11.

In this case, the photoelectric conversion element 11 which is FCB-mounted on the lid portion 30 is accommodated in the cavity portion 23 between the lid portion 30 and the base 20, and the external wiring 15 is disposed along the surface of the notch 25. Therefore, downsizing and thinning are achieved. Further, the photoelectric conversion element 11 is covered by the base 20 and the lid portion 30, and hence the photoelectric conversion element 11 can be protected to improve the reliability. Besides, the base 20 having a substantially plate shape can be directly mounted on the circuit board 3 or the like, and hence the posture can be stabilized to improve the optical characteristics. According to the method of manufacturing the optical sensor 1 of this embodiment, the optical sensor 1 described above can be manufactured with ease.

In this embodiment, the groove portion 27 is provided in the surface of the base 30 on the concave portion 21 side (bonding surface 14), but the groove portion 27 may not be provided. In the case where the internal wiring 13 is a thin film having a thickness of, for example, about several tens nm to several μm, if the base 20 and the lid portion 30 are bonded to each other by an insulating adhesive, the base 20 and the lid portion 30 can be bonded to each other without being affected by a step of the internal wiring 13 even when the groove portion 27 is not provided.

In the case where the base 20 and the lid portion 30 are bonded to each other by anodic bonding, or Au—Sn bonding or Au—Au bonding (metal bonding), if the groove portion 27 is provided in the base 30, the following configuration may be employed. That is, the internal wiring 13 is accommodated in the groove portion 27, and the base 20 and the lid portion 30 are bonded at a region excluding the groove portion 27 of the surface (inside surface) of the base 20, and after bonding, an adhesive material or the like is loaded in a gap due to the groove portion 27 for sealing. Alternatively, if the gap due to the groove portion 27 is small enough not to affect the reliability, the gap may be left as it is.

Figure 6:
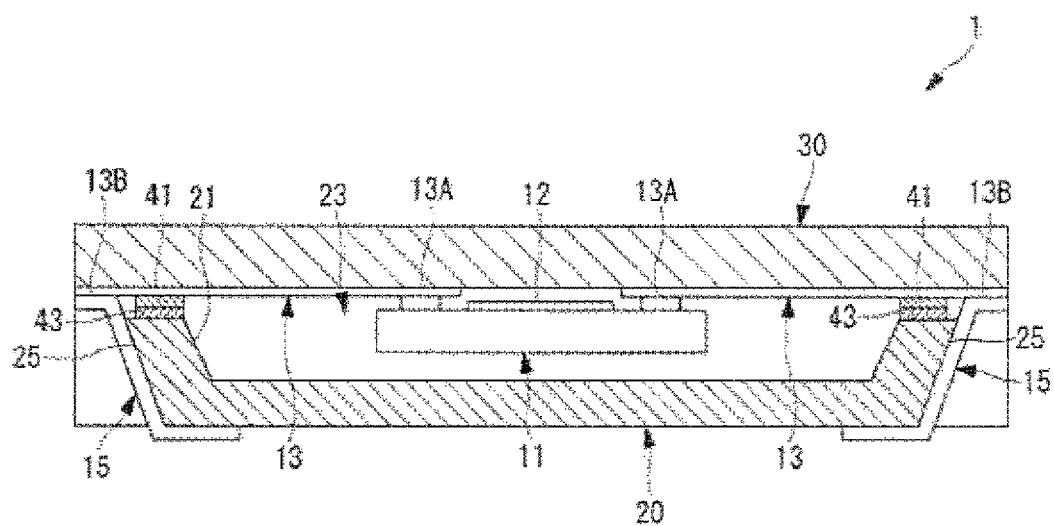
FIG. 6 is a schematic vertical cross-sectional view illustrating the case where the base and the lid portion are bonded through the intermediation of an insulating layer and a metal film layer.
Figure 7:
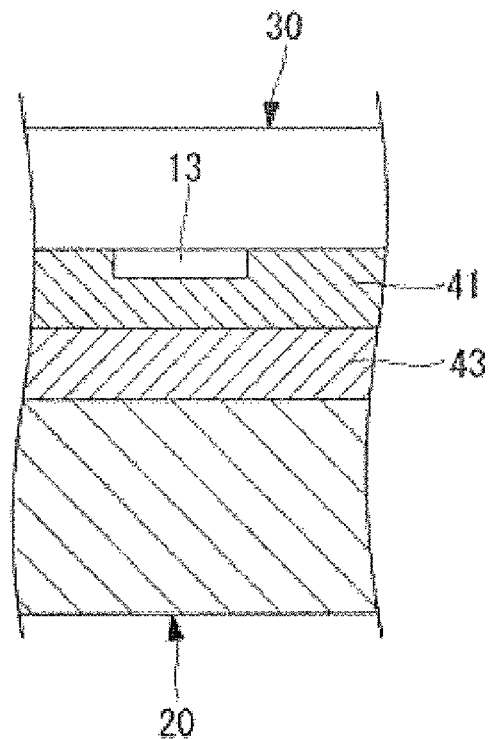
FIG. 7 is a schematic vertical cross-sectional view illustrating a stacked state of an internal wiring, the insulating layer, and the metal film layer of FIG. 6 in an enlarged scale.
Figure 8:
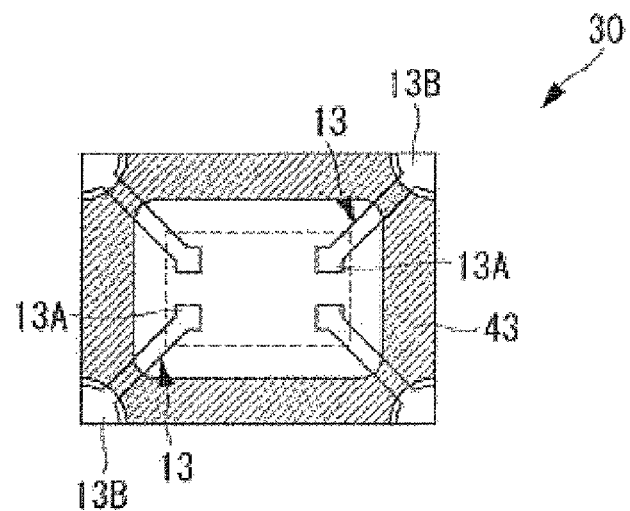
FIG. 8 is a plan view of an inside surface of the lid portion of FIG. 6 as viewed in the thickness direction.

In the case where the base 20 and the lid portion 30 are bonded to each other by anodic bonding, or Au—Sn bonding or Au—Au bonding, if the groove portion 27 is not provided in the base 30, for example, as illustrated in FIGS. 6 to 8, an insulating layer (such as silicon oxide ($SiO_2$), silicon nitride ($Si_3N_4$), or polyimide) 41 may be formed on the internal wiring 13 formed on the lid portion 30, and a bonding metal film layer (such as Si, Al, Au, Sn, or an alloy thereof) 43 may be formed on the insulating layer 41 (on the base 20 side).

In this case, when the step of the internal wiring 13 affects the flatness on the insulating layer 41, the insulating layer 41 may be polished into a flat surface. It is desired that the insulating layer 41 and the metal film layer 43 be formed so as not to be overlapped with the notch 25 of the base 20 and the electrode portion of the photoelectric conversion element 11. It is also desired that the metal film layer 43 be formed on the insulating layer 41 so as to have the same shape and the same size as those of the insulating layer 41, or be formed so as to be smaller than the insulating layer 41. When the thickness of each of the internal wiring 13, the insulating layer 41, and the metal film layer 43 is set to equal to or smaller than several tens nm, the gap generated between the notch 25 and the internal wiring 13 can be reduced and hence the wirings can be connected without disconnection during wiring formation. As countermeasures against the influence of the gap, the electrode connection portion 13B of the internal wiring 13 may be laminated, or a conductive member such as Ag paste may be loaded in the notch 25.

This embodiment may be modified as follows.

Figure 9:
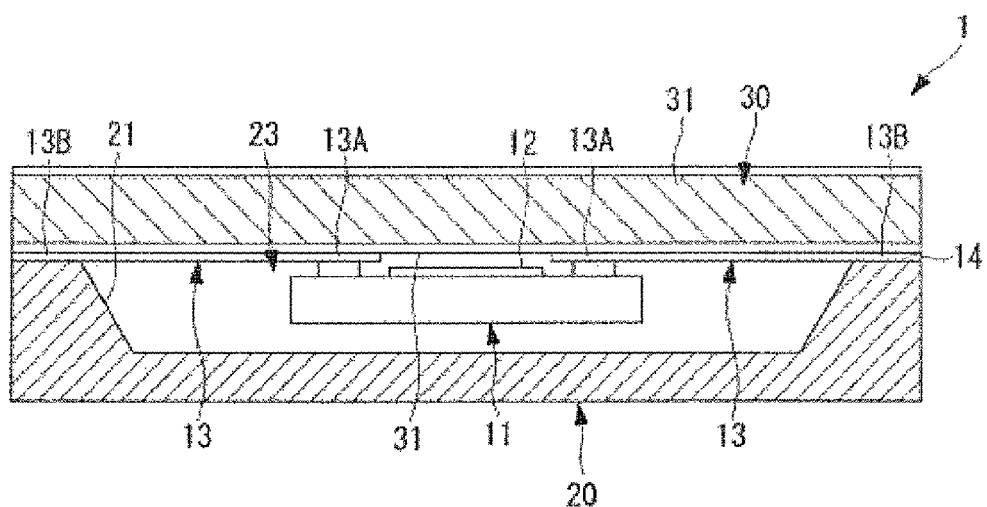
FIG. 9 is a vertical cross-sectional view of an optical sensor according to a first modified example of the embodiment of the present invention.

As a first modified example, for example, as illustrated in FIG. 9, the base 20 may be made of a colored glass material that does not transmit light or a colored glass material having light blocking properties but not affecting the characteristics of the photoelectric conversion element 11. The lid portion 30 may be provided with thin film filters (optical filters) 31 on both sides thereof for limiting the wavelength of light to be transmitted. In this case, the base 20 to be used may be blackened by mixing metallic powder such as manganese into the glass material, for example.

This configuration prevents external light from transmitting through the base 20 to be received by the light receiving portion 12. In general, the photoelectric conversion rate of an optical element fluctuates depending on the wavelength of received light. With the thin film filters 31 provided for limiting the wavelength of light to be transmitted through the lid portion 30, the influence of the fluctuations in photoelectric conversion rate caused by the wavelength dependency of the photoelectric conversion element 11 can be reduced, and the intensity of light can be detected with high accuracy. The thin film filter 31 may be a single layer or a multi-layer, and may be provided only on one surface of the lid portion 30 instead. It is preferred to form the thin film filter 31 on the surface of the lid portion 30, which prevents the warpage of the thin film filter 31.

Figure 10:
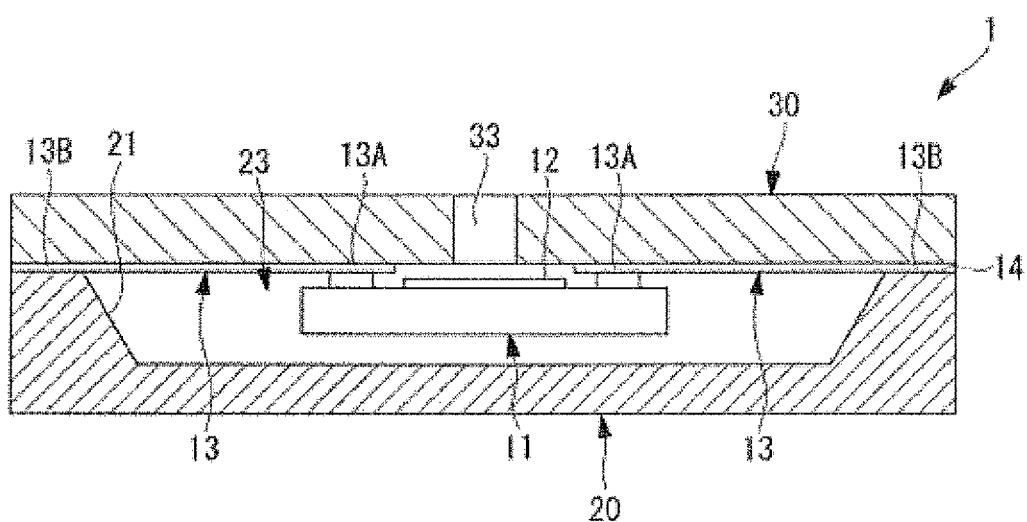
FIG. 10 is a vertical cross-sectional view of an optical sensor according to a second modified example of the embodiment of the present invention.

As a second modified example, for example, as illustrated in FIG. 10, the base 20 may be configured as in the first modified example, and the lid portion 30 may be made of a colored glass material that does not transmit light or a colored glass material having light blocking properties but not affecting the characteristics of the photoelectric conversion element 11. Further, in the lid portion 30, a transmission region 33 through which light can be transmitted may be provided only in a range in which the light receiving portion 12 of the photoelectric conversion element 11 faces the lid portion 30. It is desired that the transmission region 33 of the lid portion 30 have, for example, characteristics as an optical filter for limiting the wavelength of light to be transmitted.

This configuration limits an incident direction of light to be received by the light receiving portion 12 of the photoelectric conversion element 11 in the transmission region 33 of the lid portion 30, thereby preventing external light from transmitting through the entire base 20 or a region outside the range in which the light receiving portion 12 of the photoelectric conversion element 11 faces the lid portion 30 and being received by the receiving portion 12. Thus, the intensity of desired light can be detected with high accuracy.

Hereinabove, the embodiment of the present invention has been described in detail with reference to the accompanying drawings. However, specific structures of the present invention are not limited to the embodiment, and include design modifications and the like without departing from the gist of the present invention. For example, in the above-mentioned embodiment, the notch 25 and the external wiring 15 are disposed at each of the four corners of the base 20, and the wiring connection portion 13B of the internal wiring 13 is disposed at each of the four corners of the lid portion 30. However, it is sufficient that the wiring connection portion 13B of the internal wiring 13 is connected to the other end of the external wiring 15 formed along the surface of the notch 25. Thus, each of the notch 25 and the external wiring 15 only needs to be disposed at the peripheral edge of the base 20, and the wiring connection portion 13B of the internal wiring 13 only needs to be disposed at a position in the vicinity of the peripheral edge of the lid portion 30 so as to oppose the notch 25 and the external wiring 15.

In the above-mentioned embodiment, the plurality of lid portions 30 and the plurality of bases 20 are collectively formed from a large-sized lid member and a large-sized base member, respectively. However, for example, the optical sensor 1 may be manufactured by combining the individually-formed lid portion 30 and base 20. Further, the method of manufacturing the optical sensor 1 includes the concave portion forming step S3, the notch forming step S4, and the dicing step S7, but may omit those steps. In this case, a base 20 in which the notch 25 and the concave portion 21 are formed in advance may be used, or a lid portion 30 and a base 20 which are already cut into individual pieces may be used.

Figure 11A:
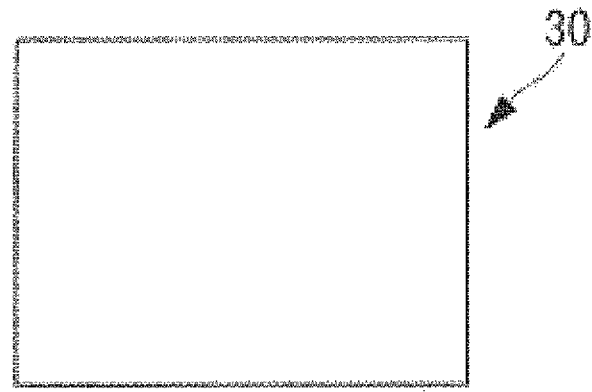
FIG. 11A is a plan view of an outside surface of a lid portion according to another modified example of the embodiment of the present invention as viewed in the thickness direction.
Figure 11B:
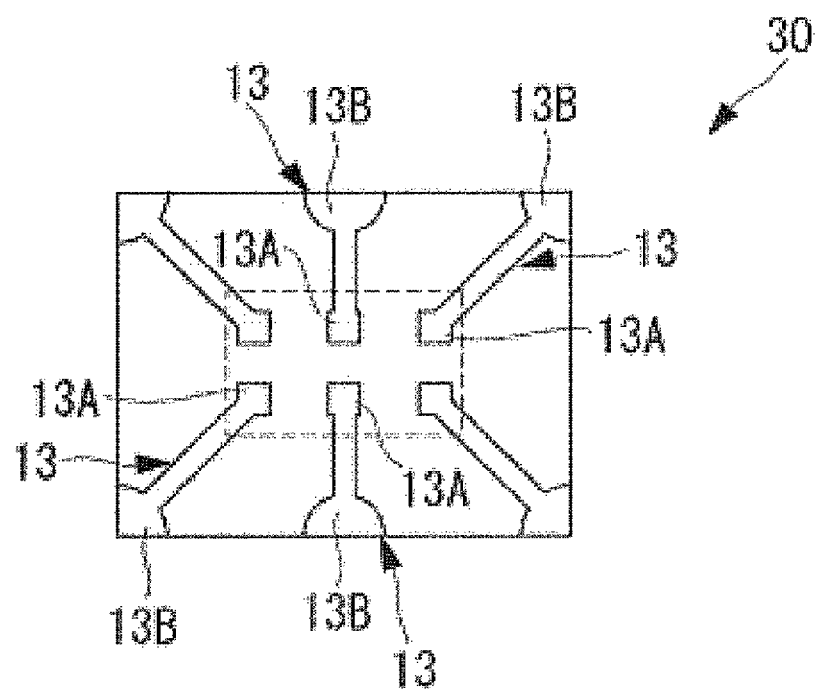
FIG. 11B is a plan view of an inside surface of the lid portion of FIG. 11A as viewed in the thickness direction.

In the above-mentioned embodiment, the optical sensor 1 includes four internal wirings 13, but only needs to include a plurality of internal wirings 13. For example, in the case where the optical sensor 1 includes six internal wirings 13, as illustrated in FIGS. 11A and 11B, one end (element connection portion 13A) of each of the internal wirings 13 is disposed in the vicinity of the center of the lid portion 30, and the other end (wiring connection portion 13B) is disposed at each of the four corners of the lid portion 30 and at the peripheral edge in each of the vicinities of the middle between two corners. In this case, as illustrated in FIGS. 12A and 12B, the notch 25 may be formed in the base 20 at each position opposed to the wiring connection portion 13B of the internal wiring 13 formed on the lid portion 30, that is, at each of the four corners of the base 20 and at the peripheral edge in each of the vicinities of the middle between two corners.

In this configuration, with the use of a large-sized base member and a large-sized lid member, the internal wirings 13 can be formed collectively in regions of adjacent lid portions 30 in the internal wiring forming step S1. Further, the notches 25 can be formed collectively in regions of adjacent bases 20 in the notch forming step S4, and the external wirings 15 can be formed collectively in the regions of adjacent bases 20 in the external wiring forming step S6. In this way, by increasing the number of the notches 25 formed between the corner portions at the peripheral edge of the base 20 and the number of the external wirings 15 formed on the surface of the respective notches 25, it is possible to increase the number of internal wirings 13 as well.

What is claimed is:

1. An optical sensor, comprising:
   a base made of a glass material and having a substantially plate shape, a concave portion formed in a surface of the base, and a plurality of notches each formed at a corner of a peripheral edge along an outside surface of the base;
   a lid portion made of a glass material, the lid portion having a flat plate shape and being stacked and bonded onto the surface of the base so as to close the concave portion to form a cavity portion;
   an optical element having a light receiving portion for receiving light, the optical element being disposed on a back surface of the lid portion opposite to the base so that the light receiving portion faces the back surface of the lid portion, and the optical element being configured to photoelectrically convert light transmitted through the lid portion and received by the light receiving portion;
   a plurality of internal wirings formed on the back surface of the lid portion opposed to the base, the plurality of internal wirings each including an element connection portion connected to the optical element and a wiring connection portion disposed at a position opposed to a corresponding one of the plurality of notches of the base; and
   a plurality of external wirings disposed along a surface of the corresponding one of the plurality of notches so that one end is connected to the wiring connection portion of a corresponding one of the plurality of internal wirings and another end is exposed on a surface of the base on an opposite side of the lid portion.

2. An optical sensor according to claim 1, wherein:
   the base is made of a light-blocking glass material; and
   the lid portion includes, at least on the surface opposed to the base, an optical filter for limiting a wavelength of light to be transmitted.

3. An optical sensor according to claim 1, wherein:
   the base is made of a light-blocking glass material; and
   the lid portion is made of a light-blocking glass material having a transmission region through which light transmits, the transmission region being provided in a range in which the light receiving portion of the optical element faces the lid portion.

4. A method of manufacturing an optical sensor, comprising:
   forming an internal wiring on a back surface of a lid member having a flat plate shape and made of a glass material;
   mountings a photoelectric conversion element on the back surface of the lid member so that a light receiving portion of the photoelectric conversion element faces the back surface of the lid member, and connecting the photoelectric conversion element to the internal wiring;
   stacking the lid member onto which the photoelectric conversion element is mounted onto a base member having a substantially plate shape and made of a glass material, the base member including a concave portion in a surface thereof and a plurality of notches each formed at a corner of a peripheral edge along an outside surface from the peripheral edge to a bottom of the outside surface, and accommodating the photoelectric conversion element in the concave portion of the base member, followed by bonding the lid member and the base member to each other so that the lid member closes the concave portion; and
   forming an external wiring along a surface of each of the plurality of notches of the base member onto which the lid member is bonded so that one end of the external wiring is connected to the internal wiring and another end of the external wiring is exposed on a surface of the base member on an opposite side of the lid member.

5. A method of manufacturing an optical sensor according to claim 4, wherein the plurality of notches are formed at corner portions of the base member, respectively, and another end of the internal wiring is disposed at each corner portion of the lid member.

6. A method of manufacturing an optical sensor according to claim 4, wherein the base member is made of a light-blocking glass material; and wherein the lid member includes, at least on the surface opposed to the base member, an optical filter for limiting a wavelength of light to be transmitted.

7. A method of manufacturing an optical sensor according to claim 4, wherein the base member is made of a light-blocking glass material; and wherein the lid member is made of a light-blocking glass material having a transmission region through which light transmits, the transmission region being provided in a range in which the light receiving portion of the optical element faces the lid member.

8. An optical sensor comprising:
   a glass base having a concave portion and a plurality of notches each formed at a corner of a peripheral edge along an outside surface of the glass base;
   a glass lid bonded to the base and overlying the concave portion to form a cavity portion;
   a photoelectric conversion element accommodated in the cavity portion and having a light receiving portion for receiving light, the photoelectric conversion element being configured to photoelectrically convert light that is transmitted through the lid and received by the light receiving portion;
   a plurality of internal wirings each having one end connected to the photoelectric conversion element and another end disposed at a position opposed to a corresponding one of the plurality of notches of the base; and a plurality of external wirings each having one end connected to the another end of a corresponding one of the plurality of internal wirings and having another end exposed on a surface of the base disposed on an opposite side of the lid.

9. An optical sensor according to claim 8, wherein the optical element is disposed on a rear surface of the lid member confronting the concave portion of the base member so that the light receiving portion faces the rear surface of the lid member.

10. An optical sensor according to claim 8, wherein the internal wirings are formed on a rear surface of the lid member opposed to the base member.

11. An optical sensor according to claim 8, wherein the external wirings are disposed along a surface of respective ones of the plurality of notches formed on the base member.

12. An optical sensor according to claim 8, wherein the base member has a plate shape and is made of a glass material.

13. An optical sensor according to claim 12, wherein the glass material comprises a light-blocking glass material.

14. An optical sensor according to claim 13, wherein the lid member has an optical filter for limiting a wavelength of light that is transmitted through the lid member.

15. An optical sensor according to claim 13, wherein the lid member is made of a light-blocking glass material having a transmission region through which light transmits, the transmission region being provided in a range in which the light receiving portion of the optical element faces the rear surface of the lid member.

* * * * *